United States Patent [19]

Artuso et al.

[11] Patent Number: 5,268,577
[45] Date of Patent: Dec. 7, 1993

[54] RADIATION DETECTOR USING A BULK HIGH $T_c$ SUPERCONDUCTOR

[75] Inventors: Joseph F. Artuso; Larry A. Franks, both of Santa Barbara; Kenneth L. Hull, Ventura, all of Calif.; Orest G. Symko, Salt Lake City, Utah

[73] Assignee: The United States of America as represented by the United States Department of Energy, Washington, D.C.

[21] Appl. No.: 941,837

[22] Filed: Sep. 8, 1992

[51] Int. Cl.$^5$ .............................................. H01L 39/00
[52] U.S. Cl. .................................................. 250/336.2
[58] Field of Search ...................................... 250/336.2

[56] References Cited

U.S. PATENT DOCUMENTS

| | | | |
|---|---|---|---|
| 4,135,091 | 1/1979 | Lanza et al. | 250/336.2 |
| 4,484,074 | 10/1984 | Eder | 250/336.1 |
| 4,873,443 | 10/1989 | Schneider | 250/336.2 |
| 4,904,869 | 2/1990 | Schneider | 250/336.2 |
| 4,978,853 | 12/1990 | Hilal | 250/336.2 |
| 4,996,621 | 2/1991 | Ruigrok et al. | 360/126 |
| 5,028,786 | 7/1991 | Da Silva et al. | 250/336.2 |
| 5,043,580 | 8/1991 | Hartemann | 250/336.2 |

OTHER PUBLICATIONS

John Clarke, "Josephson Effect Devices," Phys. Bull. vol. 30, (1979) pp. 206–208.

*Primary Examiner*—Constantine Hannaher
*Attorney, Agent, or Firm*—Miguel A. Valdes; Roger S. Gaither; William R. Moser

[57] ABSTRACT

A radiation detector (10) is provided, wherein a bulk high $T_c$ superconducting sample (11) is placed in a magnetic field and maintained at a superconducting temperature. Photons of incident radiation will cause localized heating in superconducting loops of the sample destroying trapped flux and redistributing the fluxons, and reducing the critical current of the loops. Subsequent cooling of the sample in the magnetic field will cause trapped flux redistributed Abrikosov fluxons and trapped Josephson fluxons. The destruction and trapping of the fluxons causes changes in the magnetization of the sample inducing currents in opposite directions in a pickup coil (12) which is coupled by an input coil (15) to an rf SQUID (16).

6 Claims, 3 Drawing Sheets

RADIATION DETECTOR USING A BULK HIGH $T_c$ SUPERCONDUCTOR

The Government has rights in this invention pursuant to Contract No. AC08-88NV1067 awarded by the Department of Energy.

This invention relates to the detection of ionizing radiation, and in particular to a detector using a high $T_c$ bulk superconductor that acts as a magnetic scintillator in response to the presence of such radiation.

BACKGROUND OF THE INVENTION

There are various types of detectors currently in use for the detection of ionizing radiation such as x-rays and gamma rays. The scintillation type of detector responds to an x-ray photon by producing a flash of light from an ionizing event occurring in the detecting material, and uses a photomultiplier tube to detect and amplify the light pulse. In another type of solid state detector the charge generated in the material itself is collected and registered in an external circuit.

Such detectors rely on the principle that a photon of the ionizing radiation will impart sufficient energy to an atom or molecule of the radiation detecting substance to raise its energy level from the ground state to higher level, with a subsequent return to the ground state providing a detectable event.

One drawback of present radiation detectors is that the energy required to produce an excited state is of the order of one electron volt. This limits the ultimate resolution of an energy measurement to one electron volt.

Superconductors, on the other hand, depend upon charge carriers that are very weakly bound. As superconducting materials are cooled to the superconducting state, the current carrying electrons condense into Cooper pairs. Their binding energies are in the millielectron volts range. As a consequence, if the bonds of the Cooper pairs in a superconducting material are broken in response to the presence of ionizing radiation and if such a change can be detected, then enhanced energy resolution measurements of radiation in the millielectron volts range can be realized.

SUMMARY OF THE INVENTION

It is the principle object of the invention to provide a method and apparatus for detecting radiation using a high $T_c$ superconducting material, wherein the radiation effects produce a detectable change in the magnetic properties of the superconducting material.

Additional objects, advantages and novel features will be set forth in the description which follows, and in part will become apparent to those skilled in the art upon examination of the following, or may be learned by practice of the invention. The object and advantages of the invention may be realized and attained by means of instrumentalities and combinations pointed out in the appended claims.

To achieve the foregoing and other objectives, and in accordance with the present invention as described and broadly claimed herein, a radiation detector is provided having a bulk high $T_c$ superconducting material at a superconducting temperature and in a magnetic field, with changes in the magnetization of the material resulting from radiation effects being measured by a SQUID magnetometer.

BRIEF DESCRIPTION OF THE DRAWINGS

The accompanying drawings, which are incorporated in and form part of the application, together with the description serve to explain the principles of the invention.

DESCRIPTION OF THE PREFERRED EMBODIMENT

Figure 1:
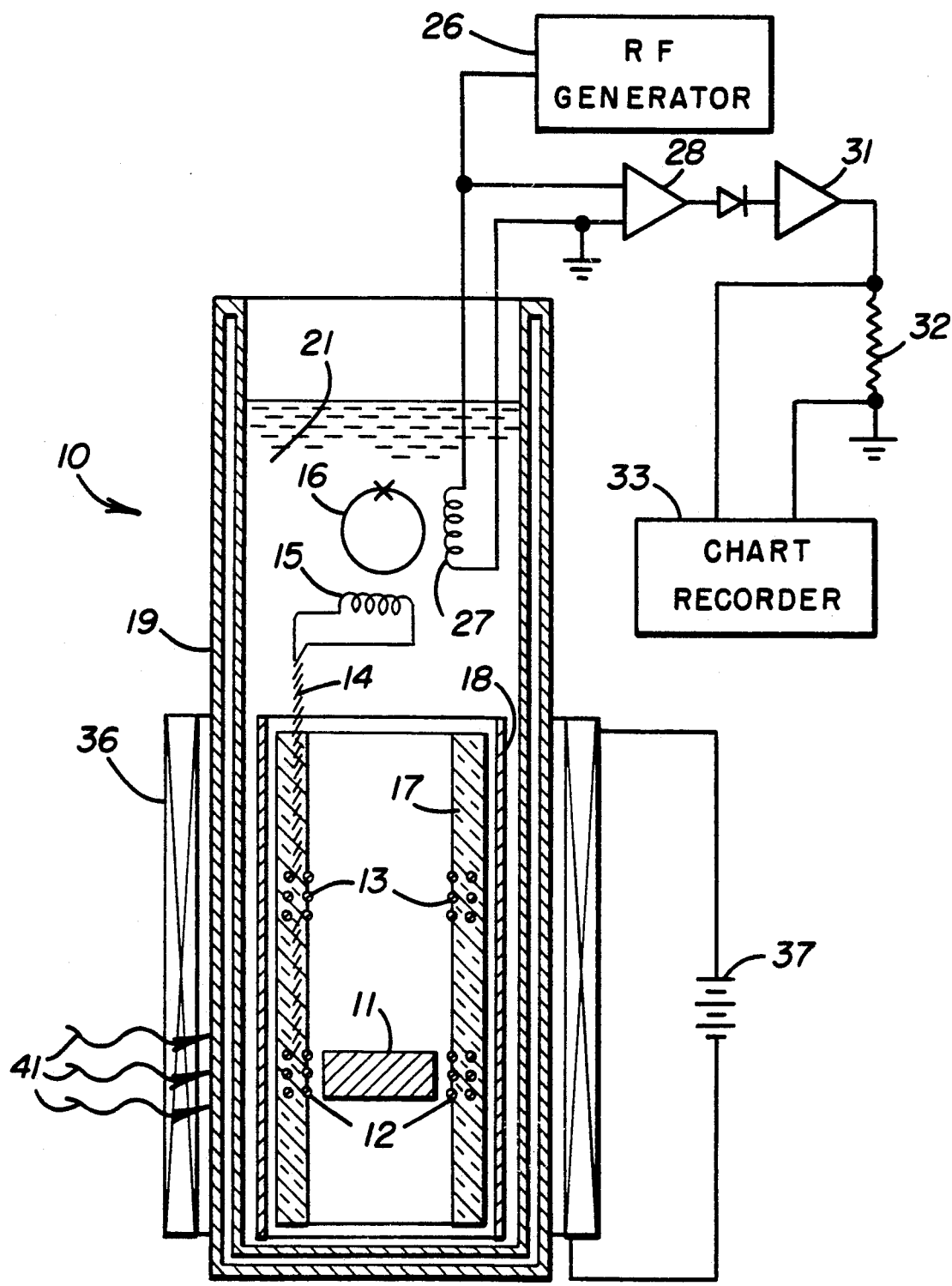
FIG. 1 illustrates a radiation detector in accordance with the present invention.

Referring now to the drawings, and in particular to FIG. 1, the radiation detector 10 includes a bulk high $T_c$ superconducting sample 11, preferably of polycrystalline YBaCuO or BiSrCaCuO, surrounded by a superconducting pickup coil 12 of niobium wire. The pickup coil is in series with a similar null coil 13 that is connected so as to eliminate the effects of stray magnetic fields. A twisted wire pair 14 connects coils 12 and 13 in series with each other and with input coil 15 that is magnetically coupled to the rf SQUID (Superconducting Quantum Interference Device) 16 utilized herein as a magnetometer. The pickup and null coils 12 and 13 are supported on a fiberglass form 17 that is surrounded by a one mil ($2.5 \times 10^{-3}$ cm.) thick lead shield 18. The lead shield serves to minimize the stray external fields in the vicinity of the coils, and also provides, as explained below, a magnetic bias to the superconducting sample 11. The system described thus far is disposed in a double-walled aluminum dewar 19 and submerged in liquid helium 21 which maintains a temperature of 4.2 degrees Kelvin.

A constant rf current from generator 26 is applied to output coil 27 which is coupled to the SQUID 16 to induce an rf flux in the device. When the quasistatic flux in the SQUID is changed, by a change in current in the input coil 15, the amplitude of the voltage across the output coil 27 will change. The rf voltage is amplified by an rf amplifier 26, detected, further amplified by amplifier 31, and fed to resister 32. Changes in voltage across feedback resister 32 will thus represent changes in magnetization of the superconductor sample Chart recorder 33 will provide a chart display of the signal voltage across resister 32 as function of time.

Initially, the dewar 19 (without liquid helium) is placed in a surrounding coil 36, powered from a voltage source 37, that creates a magnetic field that completely surrounds the cylindrical lead shield. The dewar is then filled with liquid helium. When the temperature of the lead shield 18 drops below its critical temperature, it will become superconductive. In this state it will maintain the magnetic field in the lead cylinder constant by setting up a supercurrent in the cylindrical lead shield. The coil 36 can now be removed, and the induced current in the lead shield will persist, maintaining a magnetic field internally on the superconducting sample 11.

The system is now ready to detect the presence of radiation, such as x-rays, indicated by arrows 41 on FIG. 1. Such radiation will arrive at the superconducting sample 11 by penetrating the aluminum dewar 19, the liquid helium 21, the lead shield 18 (which is thin enough to be substantially transparent to the radiation), the fiberglass form 17, and the pickup coil 12.

The high $T_c$ bulk superconductor is granular and thus it is made up of a large number of superconducting grains that are weakly linked by Josephson junctions to form superconducting loops. These loops are capable of trapping magnetic flux. Moreover, above a critical field, magnetic flux penetrates a type II superconductor in the form of Abrikosov vortices. When the sample 11 is cooled below its critical temperature in the presence of the bias magnetic field from the lead shield 18, its loops become superconductive. The magnetic field can be trapped in the interior of the loops and Abrikosov vortices will be generated due to this external magnetic field.

Since bulk high $T_c$ superconductors are granular, the grains are weakly coupled to each other thermally and hence they can be quickly heated locally. Ionizing radiation in the form of a single photon impinging upon such a sample will cause:

(i) localized heating that destroys the superconducting property of a few of these superconducting loops expelling trapped flux;

(ii) avalanche production of quasiparticles due to the break-up of Cooper pairs;

(iii) redistribution of these vortices thus changing the magnetization of the sample;

(iv) expulsion of Josephson fluxons within the Josephson barrier at the grain contacts;

(v) modification of local critical currents in the loops.

Subsequently, when the heated loops cool in the presence of the biasing magnetic field, new fields are trapped in the interior of the conducting part of these loops and there will be a new Abrikosov vortex distribution. This expulsion and retrapping of fluxons thus causes induced currents in the pickup coil 12. Since this heating and cooling proceeds at a high rate, the effect of a single photon incident on a type II superconductor, i.e. one in which an internal magnetic field can be established, is to produce a fast rising and falling pulse with a narrow width. A single high speed pulse of this kind cannot be detected with the apparatus of FIG. 1, since it has a slow response, but a large number of them will sum to produce the response shown in FIGS. 2-4. Since the individual magnetic pulses add vectorially in a random manner, they produce a noisy magnetization response locally where the radiation energy is deposited; and that is characteristic of the summation of a vector quantity in a disordered media.

Figure 2:
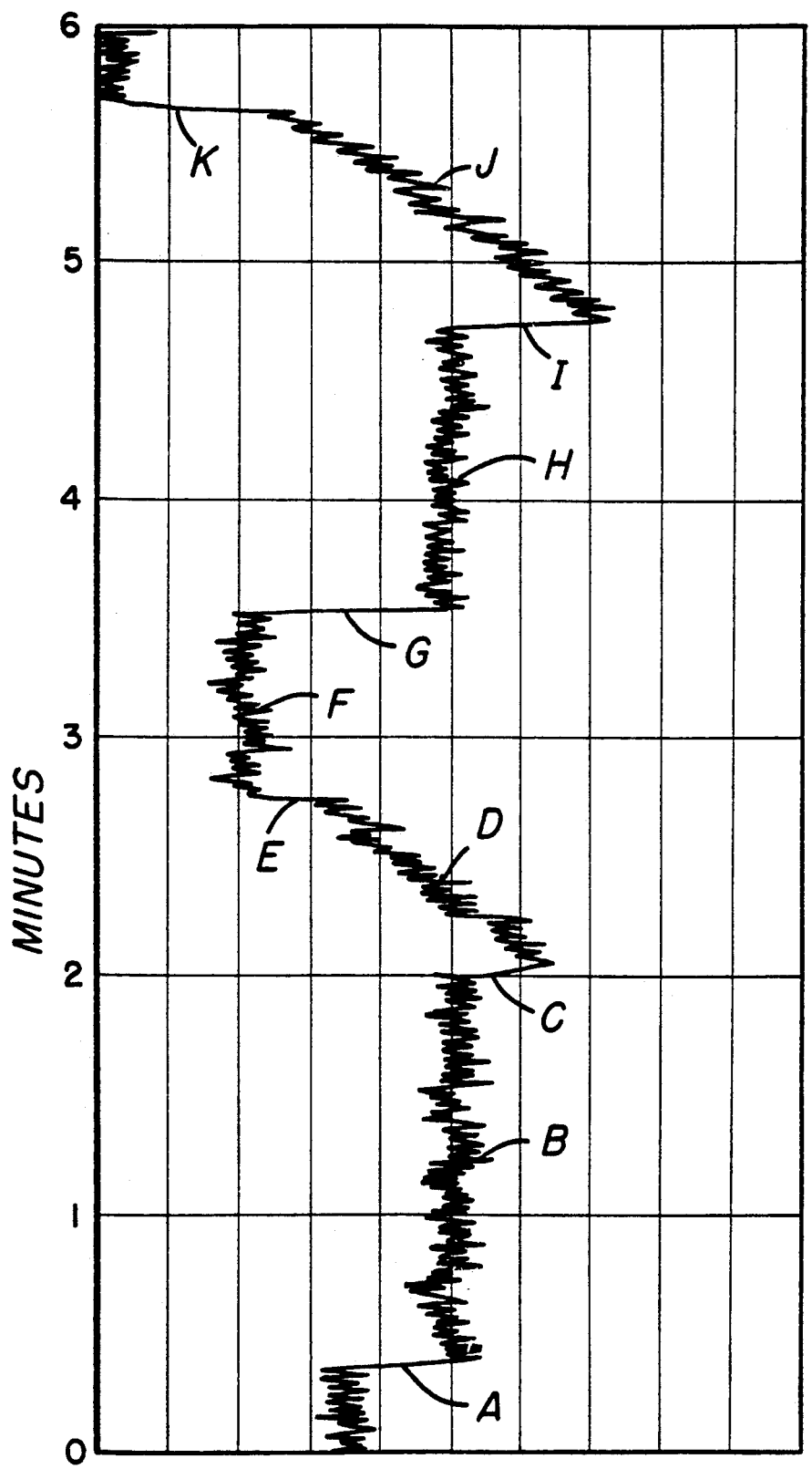
FIG. 2 illustrates the output of the chart recorder of FIG. 1 showing the response of the system to different levels of radiation during initial operation of the superconducting material.

FIG. 2 shows the response of the apparatus 10 during initial operation. Starting at the bottom of FIG. 2, the chart recorder is adjusted (A), so that the current response in pickup coil 12 is centered on the chart. There is then a noisy but constant current indication (B) until the 100 KV x-ray source is turned on (C). At this point, the current in the pickup coil increases rapidly to the right. The current then starts sloping to the left (D). The slow sloping portion of the plot is believed to be caused by the heating of a thin surface area of the lead shield by the x-ray radiation. When the x-rays are turned off, the current in the pickup coil returns (E), to the left (F) by an amount approximately that of the increase at (C), i.e. to the value it had before the x-rays were turned on except for the change introduced by the localized heating of the lead shield.

After a zero adjustment (G), there is again a noisy but constant current indication (H), until x-rays at 125 KV are turned on (I). The current in the pickup coil increases rapidly to the right (I), then slopes to the left (J), and returns rapidly to the left (K), when the x-rays are turned off.

As noted in FIG. 2, the increase in current at C for a 100 KV x-ray radiation is substantially less than the corresponding increase at I for a 125 KV x-ray radiation.

Figure 3:
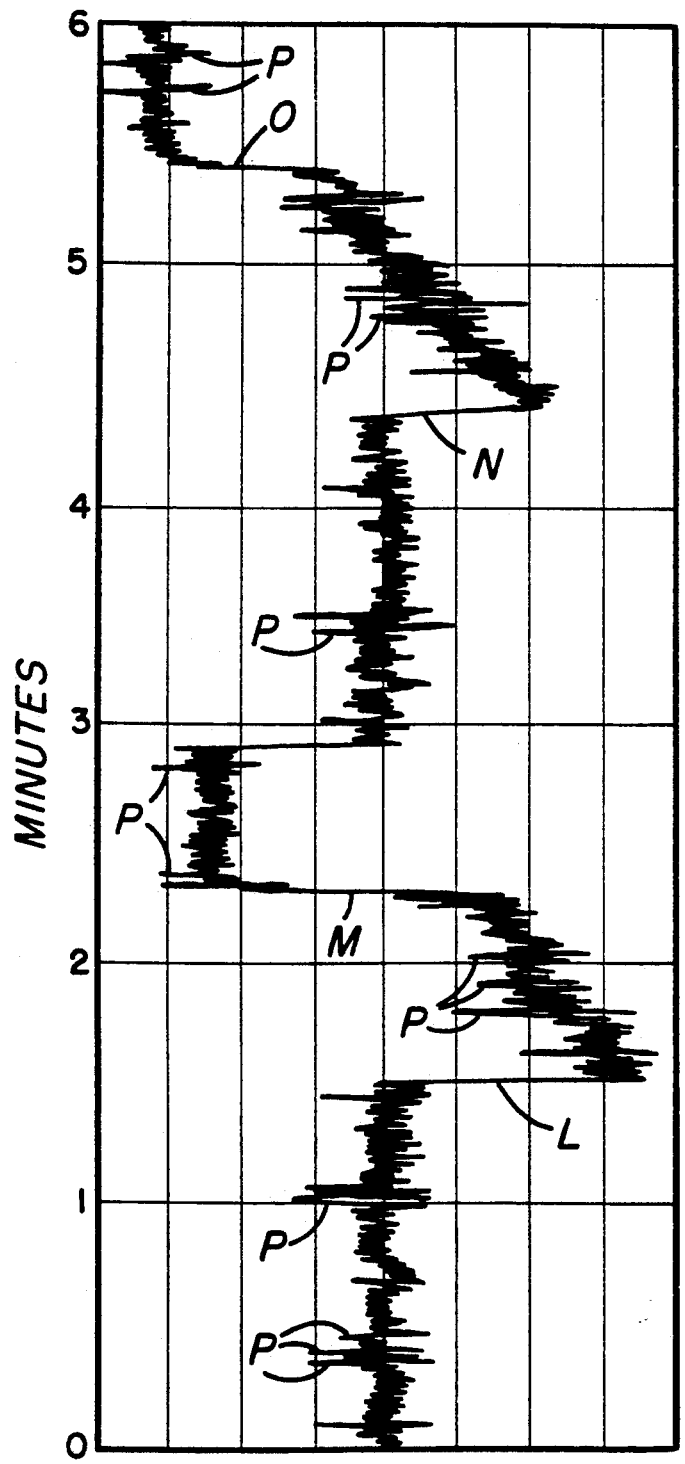
FIG. 3 illustrates the output of the chart recorder showing the response of the system to different levels of radiation after prolonged irradiation of the superconducting material.

At times, after prolonged x-ray irradiation (e.g. in the order of several hours), a "spike" response is observed. Such a response is shown in FIG. 3. As in FIG. 2, the current indication will shift to the right (L), when a 150 KV x-ray source is turned on and shift to the left (M), when the x-ray source is turned off, and will shift to the right (N), and left (O), when a 125 KV x-ray source is turned on and off. The magnitude of the shifts, again, are greater with greater voltage of the x-ray source.

FIG. 3 shows spikes P in the magnetization response. As noted, these spikes persist even when the high $T_c$ superconducting sample 11 is not being irradiated. However, when the sample is irradiated the spike production rate is increased. This is attributed to the local heating of the sample by the radiation thus affecting its magnetic properties.

Figure 4:
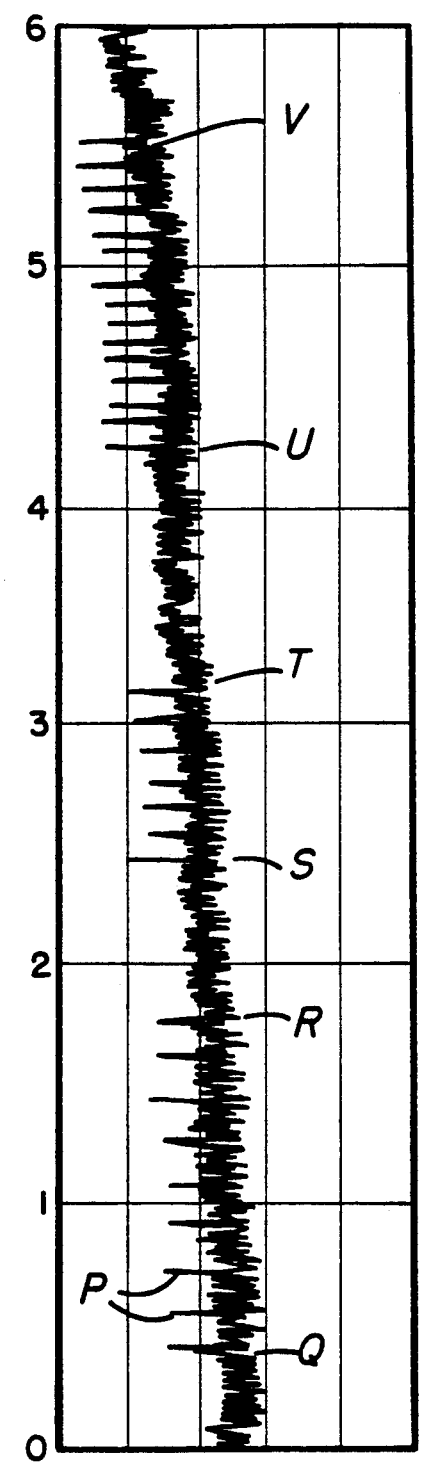
FIG. 4 illustrates the output of the chart recorder showing the response of the system to different levels of radiation after further prolonged irradiation of the superconducting material.

After further prolonged irradiation, a response as shown in FIG. 4 may be observed. In this instance, a 70 KV x-ray source was turned on at Q and off at R, an 80 KV x-ray source was turned on at S and off at T, while a 90 KV x-ray source was turned on at U and off at V. As shown on the chart, the spikes P are the only indication that sample 11 is being irradiated. This Figure shows also that the rate of occurrence of these spikes increases as the energy of the x-ray source increases.

Another important feature of the spike response of FIG. 3 is that the spikes have greater magnitude when the X-rays are on. It is believed that the increase in magnitude can be explained in terms of the fast pulses that are produced by the interactions of single photons. The observed response is the sum of a series of very narrow pluses that cannot be observed as single pulses but become observable when viewed in the aggregate as a result of local heating and changing of the critical current in the loops. However, the individual pulses occur at random and consequently, their summation results in a random varying function.

The foregoing description of the preferred embodiments has been presented for purpose of illustration and description. It is not intended to be exhaustive or to limit the invention to the precise forms described, and obviously many other modifications are possible in light of the above teaching. The embodiments were chosen in order to explain most clearly the principles of the invention and its practical applications thereby to enable others in the art to utilize most effectively the invention in various other embodiments and with various other modifications as may be suited to the particular use contemplated. It is intended that the scope of the invention be defined by the claims appended thereto.

We claim:

1. Apparatus for detecting ionizing radiation comprising:

a sample of bulk high $T_c$ superconducting material, means for maintaining said superconducting sample at a temperature lower than its critical temperature, means for maintaining a magnetic field within said superconducting sample, detection means for detecting the expulsion of trapped fluxons in said superconducting sample in response to localized heating of superconducting loops in said superconducting sample by photons of said ionizing radiation and for detecting the retrapping of fluxons in response to the subsequent cooling of said superconducting loops back down below the critical temperature of said superconducting sample.

2. Apparatus as set forth in claim 1, wherein said detection means includes a superconducting pickup coil inductively coupled to said superconducting sample, and a SQUID magnetometer inductively coupled to said pickup coil.

3. Apparatus as set forth in claim 1, wherein said means for maintaining a magnetic field is a lead shield surrounding said superconducting sample, said lead shield being at a superconductive temperature and having a circulating current induced therein.

4. Apparatus as set forth in claim 3, where said detection means includes a superconducting pickup coil disposed inside said lead shield and inductively coupled to said superconducting sample, and a SQUID magnetometer inductively coupled to said pickup coil.

5. A method of detecting ionizing radiation comprising:

generating and maintaining a magnetic field, disposing a bulk high T sample of superconducting material within said magnetic field, maintaining said superconducting sample at a temperature below its critical temperature, irradiating said sample with said ionizing radiation, detecting the expulsion of trapped fluxons in said superconducting sample in response to localized heating of superconducting loops in said superconducting sample by photons of said radiation, detecting the retrapping of fluxons in response to the subsequent cooling of said superconducting loops back down below the critical temperature of said superconducting sample.

6. The method of claim 5, wherein the steps of detecting the expulsion and retrapping of fluxon includes positioning a pickup coil relative to said superconducting sample so that said expulsion and retrapping of fluxons will induce currents in said pickup coil, and inductively coupling said pickup coil to a SQUID magnetometer.

* * * * *